(12) United States Patent
Kocon et al.

(10) Patent No.: US 11,557,673 B2
(45) Date of Patent: Jan. 17, 2023

(54) HYBRID SEMICONDUCTOR DEVICE

(71) Applicant: TEXAS INSTRUMENTS INCORPORATED, Dallas, TX (US)

(72) Inventors: Christopher Boguslaw Kocon, Mountain Top, PA (US); Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 200 days.

(21) Appl. No.: 17/136,816

(22) Filed: Dec. 29, 2020

(65) Prior Publication Data

US 2022/0209007 A1 Jun. 30, 2022

(51) Int. Cl.
| | |
|---|---|
| *H01L 29/78* | (2006.01) |
| *H01L 29/40* | (2006.01) |
| *H01L 29/417* | (2006.01) |
| *H01L 29/45* | (2006.01) |
| *H01L 29/16* | (2006.01) |
| *H01L 29/20* | (2006.01) |
| *H01L 29/66* | (2006.01) |
| *H01L 29/06* | (2006.01) |

(52) U.S. Cl.
CPC ...... *H01L 29/7816* (2013.01); *H01L 29/0673* (2013.01); *H01L 29/1608* (2013.01); *H01L 29/2003* (2013.01); *H01L 29/407* (2013.01); *H01L 29/41775* (2013.01); *H01L 29/45* (2013.01); *H01L 29/66696* (2013.01)

(58) Field of Classification Search
CPC ............. H01L 29/0673; H01L 29/1608; H01L 29/2003; H01L 29/402–407; H01L 29/41775; H01L 29/45; H01L 29/66696; H01L 29/7816–7826
See application file for complete search history.

(56) References Cited

U.S. PATENT DOCUMENTS

| | | | |
|---|---|---|---|
| 5,736,766 | A | 4/1998 | Efland et al. |
| 6,424,005 | B1 | 7/2002 | Tsai et al. |
| 10,084,073 | B2 | 9/2018 | Qi |
| 2004/0031981 | A1 | 2/2004 | Grivna |
| 2008/0012069 | A1 | 1/2008 | Mizokuchi |
| 2016/0247880 | A1 | 8/2016 | Tesson et al. |
| 2016/0322347 | A1 | 11/2016 | Meiser et al. |
| 2017/0018617 | A1 | 1/2017 | Xia et al. |
| 2017/0373054 | A1 | 12/2017 | Tesson et al. |
| 2020/0013888 | A1* | 1/2020 | Su ................ H01L 29/0653 |
| 2020/0052103 | A1* | 2/2020 | Tao ................ H01L 29/7787 |

OTHER PUBLICATIONS

PCT/US 2021/065280, PCT International Search Report, dated Apr. 7, 2022.

* cited by examiner

*Primary Examiner* — Eric A. Ward
(74) *Attorney, Agent, or Firm* — Jacqueline J. Garner; Frank D. Cimino

(57) ABSTRACT

A semiconductor device includes a switch element having a surface and first and second regions and including a first semiconductor material having a band-gap. The first region of the switch element is coupled to a source contact. A floating electrode has first and second ends. The first end of the floating electrode is coupled to the second region of the switch element. A voltage-support structure includes a second semiconductor material having a band-gap that is larger than the band-gap of the first semiconductor material. The voltage-support structure is in contact with the second end of the floating electrode. A drain contact is coupled to the voltage-support structure.

20 Claims, 14 Drawing Sheets

HYBRID SEMICONDUCTOR DEVICE

BACKGROUND

Semiconductor switching devices, such as silicon switching devices, have a wide range of applications. Semiconductor switching devices include diodes, bipolar transistors, field-effect transistors (FET), etc. For example, silicon laterally-diffused metal oxide semiconductor (LDMOS) field-effect transistor (FET) can be used as a power switch in the power electronics industry.

SUMMARY

In some examples, a semiconductor device includes a switch element having a surface and first and second regions and including a first semiconductor material having a band-gap. The first region of the switch element is coupled to a source contact. A floating electrode has first and second ends. The first end of the floating electrode is coupled to the second region of the switch element. A voltage-support structure includes a second semiconductor material having a band-gap that is larger than the band-gap of the first semiconductor material. The voltage-support structure is in contact with the second end of the floating electrode. A drain contact is coupled to the voltage-support structure.

In certain examples, a semiconductor device includes a source contact. A switch element has a surface. A first semiconductor region is of a first doping-polarity and includes a channel region. A source region is of a second doping-polarity and in contact with the source contact and the first semiconductor region. A drain region is of the second doping-polarity and in contact with the first semiconductor region. A gate corresponds to the channel region of the first semiconductor region. The first semiconductor region, the source region, and the drain region each includes a first semiconductor material having a band-gap. A floating electrode has first and second ends. The first end of the floating electrode is coupled to the drain region of the switch element. A voltage-support structure includes a second semiconductor material having a band-gap that is larger than the band-gap of the first semiconductor material. The voltage-support structure is in contact with the second end of the floating electrode. A drain contact is coupled to the voltage-support structure.

In certain examples, a formation method for forming a semiconductor device includes forming a switch element that includes a first semiconductor material having a band-gap. A floating electrode having first and second ends is formed. The first end of the floating electrode is coupled to the switch element. A voltage-support structure is formed. The voltage-support structure includes a second semiconductor material having a band-gap that is larger than the band-gap of the first semiconductor material. A source contact is formed, coupled to the switch element. A drain contact is formed, coupled to the voltage-support structure. A field control element is formed.

BRIEF DESCRIPTION OF THE DRAWINGS

For a detailed description of various examples, reference will now be made to the accompanying drawings in which.

DETAILED DESCRIPTION

Progress of silicon devices is slowing and ultimately limited by silicon material properties. After more than 30 years of silicon processing development, ability to use current semiconductor fabrication is a path to quick adoption and improved performance to cost ratio when making semiconductor devices, such as a laterally-diffused metal oxide semiconductor (LDMOS) field-effect transistor (FET).

The described examples include a hybrid semiconductor device and a formation method for forming the hybrid semiconductor device. The illustrative hybrid semiconductor device includes a source contact, a switch element having a first semiconductor material with a band-gap, a voltage-support structure including a second semiconductor material with a band-gap that is larger than the band-gap of the first semiconductor material, a floating electrode between the switch element and the voltage-support structure and coupling the switch element to the voltage-support structure, a drain contact coupled to the voltage-support structure, and one or more field control elements. The hybrid semiconductor device may combine a reliable switch element such as silicon switch element with wide band-gap (WBG) semiconductor. The WBG semiconductor in the hybrid semiconductor device may provide a voltage support region to take a portion or a large portion of the applied voltage on the hybrid semiconductor device, such that the voltage applied to other portions of the hybrid semiconductor device, such as the silicon switch element/portion, may be reduced. Accordingly, the critical voltage of the hybrid semiconductor device may be increased.

Figure 1:
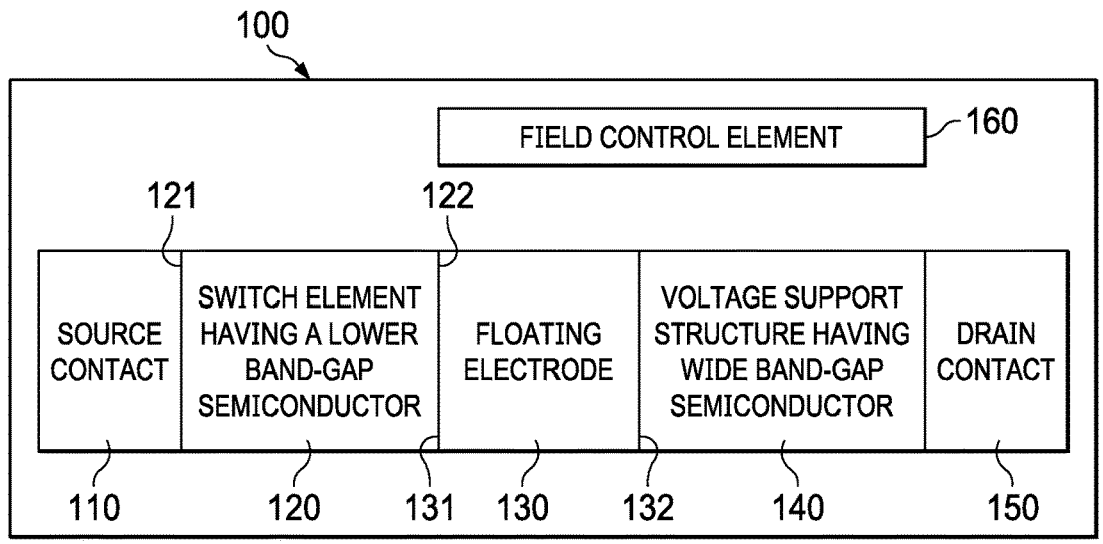
FIG. 1 illustrates a block diagram of an example hybrid semiconductor device according to described examples.

FIG. 1 illustrates a block diagram of an example hybrid semiconductor device according to described examples. The hybrid semiconductor device 100 includes a source contact 110, a switch element 120 having a first semiconductor material with a band-gap (i.e., energy band-gap), a voltage-support structure 140 including a wide band-gap (WBG) semiconductor material with a band-gap that is larger than the band-gap of the first semiconductor material of the switch element 120, a floating electrode 130 between the switch element 120 and the voltage-support structure 140 and coupling the switch element 120 to the voltage-support structure 140, a drain contact 150 coupled to the voltage-support structure 140, and a field control element 160. The floating electrode 120 has a first end 131 and a second end 132; the first end 131 of the floating electrode 130 is coupled to and in ohmic contact with the switch element 120; and the second end 132 of the floating electrode 130 is coupled to and in ohmic contact with the voltage support structure 140. A floating electrode may electrically couple a first component to a second component, without being in contact with additional voltage or current terminals other than the components being coupled. In some examples, the first semiconductor material of the switch element 120 includes at least one of silicon, germanium, or gallium arsenide.

In some examples, the first end 131 of the floating electrode 131 is in ohmic contact with a second region 122 of the switch element 120; the second end 132 of the floating electrode 130 is in ohmic contact with the voltage-support structure 140; and a first region 121 of the switch element 120 is in ohmic contact with the source contact 110. In some examples, the field-control element 160 extends from the switch element 120 towards the drain contact 150.

The structures/components 110, 120, 130, 140, 150, and 160 may be arranged in various directions with respect to one another, e.g., in-plane direction, out-of-plane direction, and/or any other suitable direction, according to application scenarios. In one example, the voltage-support structure 140 is on the floating electrode 130 and the switch element 120 along an out-of-plane direction. In another example, the voltage-support structure 140 is adjacent to the floating electrode 130 and the switch element 120 along an in-plane direction.

A doped semiconductor may be a p-type semiconductor which is doped with electron-acceptor dopants or an n-type semiconductor which is doped with electron-donor dopants. Any of the following doping levels may be chosen for components of the hybrid semiconductor device according to various application scenarios. A doping level of a p-type semiconductor may be a P− doping level that is less than $3 \times 10^{16}$ cm$^{-3}$, a P doping level in a range of $3 \times 10^{16}$ cm$^{-3}$ to $1 \times 10^{19}$ cm$^{-3}$, or a P+ doping level that is higher than $1 \times 10^{19}$ cm$^{-3}$. A doping level of an n-type semiconductor may be an N− doping level that is less than $3 \times 10^{16}$ cm$^{-3}$, an N doping level in a range of $3 \times 10^{16}$ cm$^{-3}$ to $1 \times 10^{19}$ cm$^{-3}$, or an N+ doping level that is higher than $1 \times 10^{19}$ cm$^{-3}$. A doping-polarity may refer to a p-type doping or an n-type doping.

Figure 2:
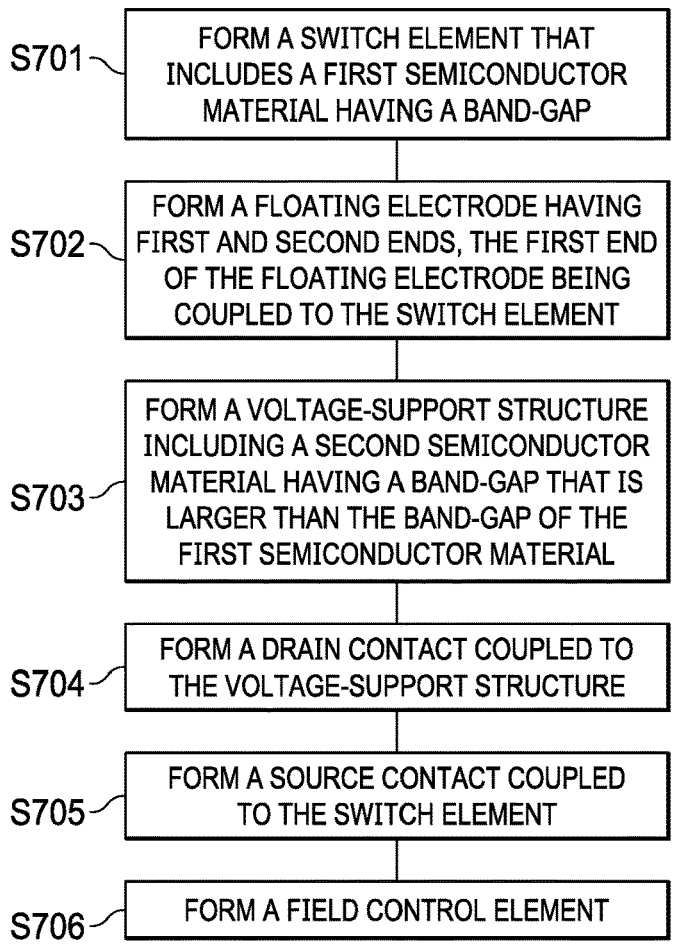
FIG. 2 illustrates a flow chart of an example method for forming a hybrid semiconductor device.

FIG. 2 illustrates a flow chart of an example method for forming a hybrid semiconductor device, which is described below with reference to FIG. 1.

At S701, a switch element that includes a first semiconductor material having a band-gap is formed. In some examples, the switch element (e.g., 120) is formed by, e.g., vapor deposition, ion implantation, and/or etching. In some examples, the switch element 120 includes at least one of a diode, a bipolar transistor, a field-effect transistor (FET), or an insulated-gate bipolar transistor (IGBT); and a material of the switch element 120 includes silicon having a band-gap. In some examples, the field-effect transistor is a p-type field-effect transistor or an n-type field-effect transistor that includes a gate. In some examples, the switch element includes a laterally-diffused metal oxide semiconductor (LDMOS) field-effect transistor. In some examples, the switch element includes an insulated-gate bipolar transistor (IGBT), such as a lateral insulated-gate bipolar transistor (LIGBT).

At S702, a floating electrode having first and second ends is formed. In some examples, the floating electrode 120 having first and second ends (131, 132) is formed by, e.g., deposition; the first end 131 of the floating electrode 130 is coupled to and in ohmic contact with the switch element 120; and the second end 132 of the floating electrode 130 is coupled to and in ohmic contact with the voltage support structure 140.

At S703, a voltage-support structure including a second semiconductor material having a band-gap that is larger than the band-gap of the first semiconductor material is formed. In some examples, the voltage-support structure 140 is formed by deposition and/or ion implantation, where the voltage-support structure 140 includes a WBG semiconductor material having a band-gap that is larger than the band-gap of the first semiconductor material, such as silicon, of the switch element 120.

At S704, a drain contact coupled to the voltage-support structure is formed. In some examples, the drain contact 150 is formed by deposition, and the drain contact 150 is coupled to and in ohmic contact with the voltage-support structure 140.

At S705, a source contact coupled to the switch element is formed. In some examples, the source contact 110 is formed by deposition, and the source contact 110 is coupled to and in ohmic contact with the switch element 120.

At S706, a field control element is formed. In some examples, the field control element 160 include a field plate, and the field plate is formed by deposition. In other examples, the field control element 160 includes a component of the switch element 120 that is formed during the formation of the switch element 120.

In the present disclosure, steps or processes may be performed in any suitable order. In some examples, forming the switch element that includes the first semiconductor material (S701) may be performed before forming the voltage-support structure including the second semiconductor material (S703). In other examples, forming the switch element that includes the first semiconductor material (S701) may be performed after forming the voltage-support structure including the second semiconductor material (S703). For example, after the voltage-support structure including the second semiconductor material is formed, the switch element that includes the first semiconductor material is formed, e.g., via a process for forming an LDMOS FET.

Figure 10:
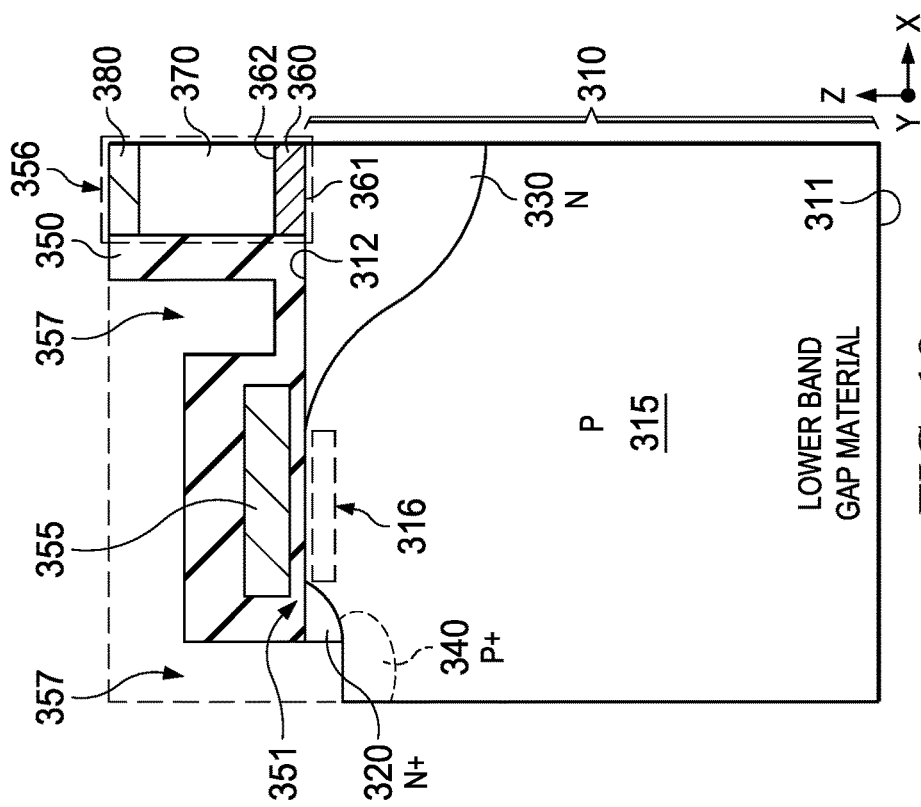
Figure 11:
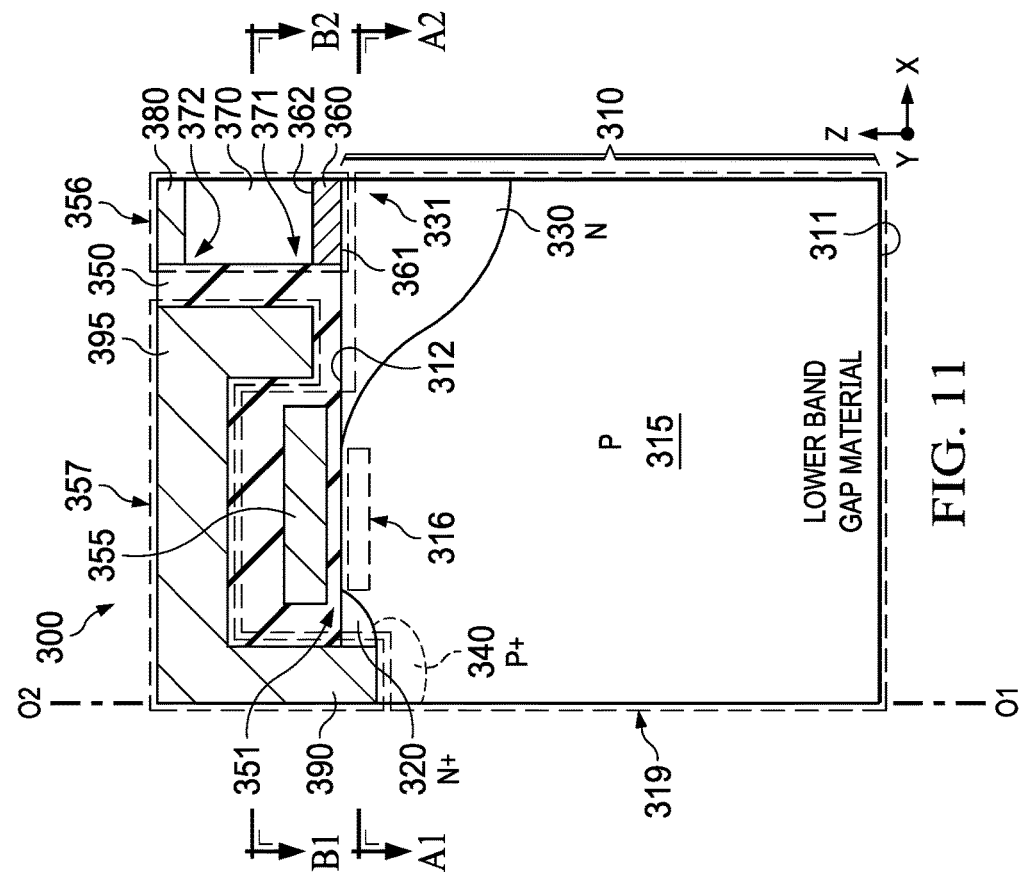
Figure 12:
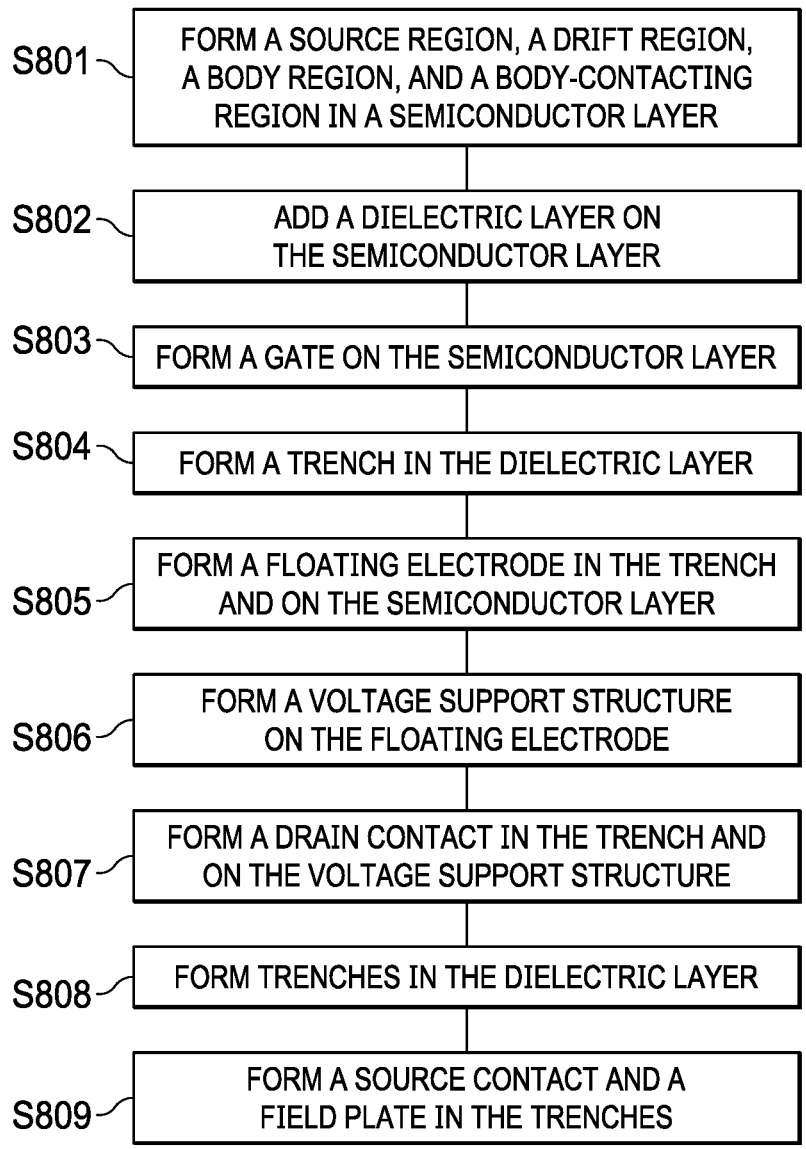
FIG. 12 illustrates a flow chart of another example method for forming the hybrid semiconductor device of FIG. 11.

FIGS. 3 to 11 illustrate cross-sectional views of structures of various stages of the formation of an example hybrid semiconductor device 300, and FIG. 12 illustrates a corresponding flow chart of an example method for forming the hybrid semiconductor device 300. FIGS. 3-11 will now be described along with references to the flow chart of FIG. 12.

Figure 3:
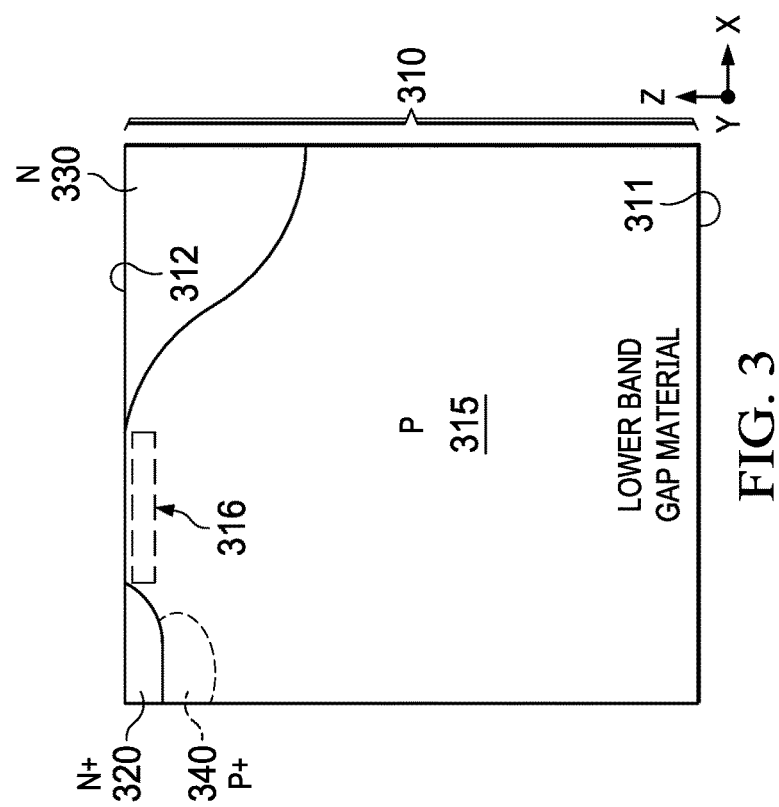

FIG. 3 illustrates a semiconductor layer 310 including a source region 320, a drift region 330, a body region 315 including a channel region 316, and a body-contact region 340; and FIG. 12 illustrates this step as forming a source region, a drift region, a body region, and a body-contact region in a semiconductor layer in step S801 of FIG. 12.

The semiconductor layer 310 has a first surface 311 and an opposing second surface 312. The semiconductor layer 310 may be a substrate or an epitaxial layer grown on a substrate. FIG. 3 also illustrates a coordinate system having X, Y, and Z axes. The X-axis and the Y-axis are orthogonal to each other and are parallel to a plane of the semiconductor layer 310, e.g., the first surface 311, or the second surface 312. The X and Y-axes are thus referred to as "in-plane direction." The Z-axis is perpendicular to the X and Y-axes and thus perpendicular to the plane of semiconductor layer 310. As such, the Z-axis is referred to as an "out-of-plane direction." Along an in-plane direction (X-axis), the channel region 316 of the body region 315 is between the source region 320 and the drift region 330, serves a conducting channel between the source region 320 and the drift region 330.

In some examples, the semiconductor layer 310 is formed by epitaxial growth and/or ion implantation to form, e.g., a p-type layer at a P doping level; and the semiconductor layer 310 includes the body region 315 at a P doping level. The source region 320, the drift region 330, and the body-contact region 340 may be formed by ion implantation of dopants into the semiconductor layer 310. In the examples of FIG. 3, the source region 320 is an n-type semiconductor region with an N+ doping level; the drift region 330 is an n-type semiconductor region with an N doping level; the body region 315 is a p-type semiconductor region with a P doping level; and the body-contact region 340 is a p-type semiconductor region with a P+ doping level. Other suitable doping-polarities and doping level may be chosen for the structures (e.g., 315, 320, 330, 315, 340) according to various application scenarios. In the examples of FIG. 3, the body-contact region 340 is a recessed body-contact region. In other examples, the body-contact region is a planar body-contact region.

Figure 4:
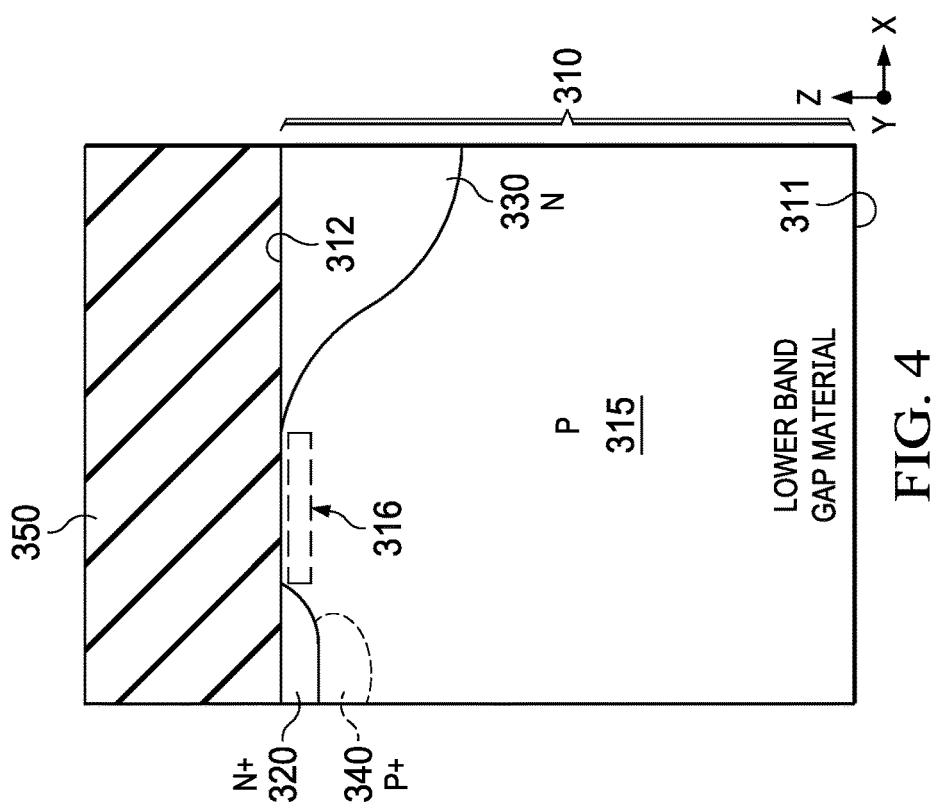
FIGS. 3 to 11 illustrate cross-sectional views of structures of various stages of the formation of an example hybrid semiconductor device according to described examples.

FIG. 4 illustrates a dielectric layer 350 on second surface 312 of the semiconductor layer 310; and FIG. 12 illustrates this step as adding a dielectric layer on the semiconductor layer in step S802 of FIG. 12. A material of the dielectric layer 350 may include nitride material such as silicon nitride, aluminum nitride, and/or oxide materials such as silicon oxide, aluminum oxide. The dielectric layer may be added on the semiconductor layer by vapor deposition or bonding.

Figure 5:
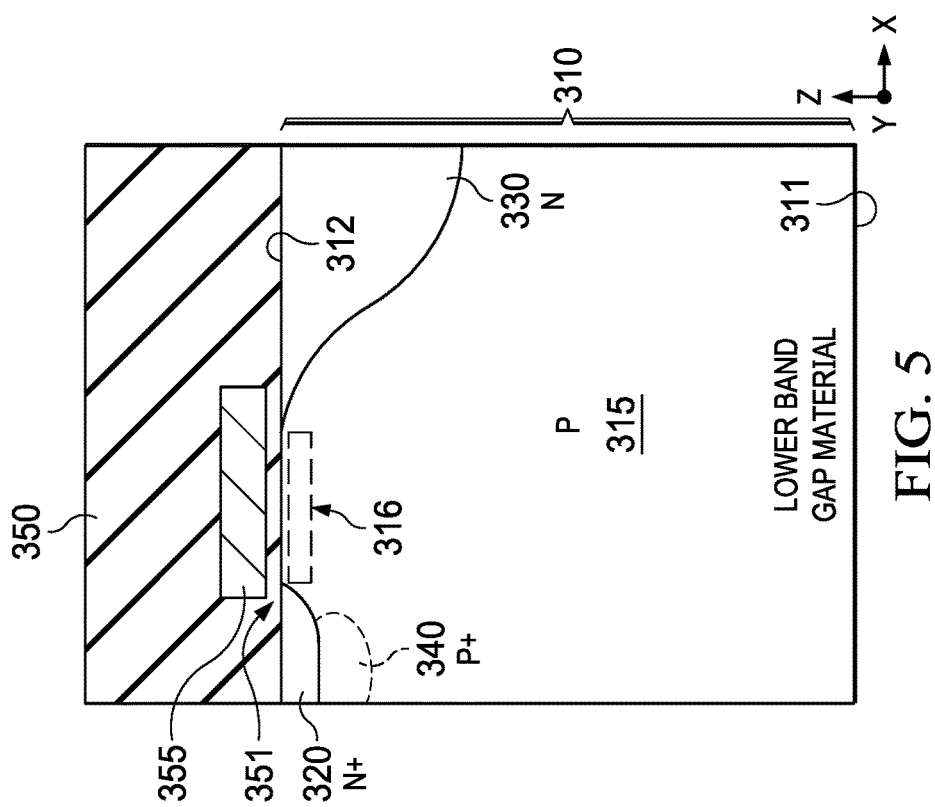

FIG. 5 illustrates a gate (e.g., a gate terminal) 355 on the second surface 312 of the semiconductor layer 310; and FIG. 12 illustrates this step as forming a gate on the semiconductor layer in step S803 of FIG. 12. In the examples of FIG. 5, the gate 355 corresponds to the channel region 316 of the body region 315, and is configured to turn on and turn off the channel region 316; and a dielectric portion 351 of the dielectric layer 350 is between the gate 355 and the second surface 312 of the semiconductor layer 310, and, accordingly, separates the gate 355 from the second surface 312 of the semiconductor layer 310.

The gate 355 may be formed by etching a trench (not shown in FIG. 5) in the dielectric layer 350 and depositing gate material into the trench. In one example, the gate material of the gate 355 may include polysilicon and/or metal. In some examples, a dielectric material such as nitride or oxide is further deposited in the trench and on the gate 355.

Figure 6:
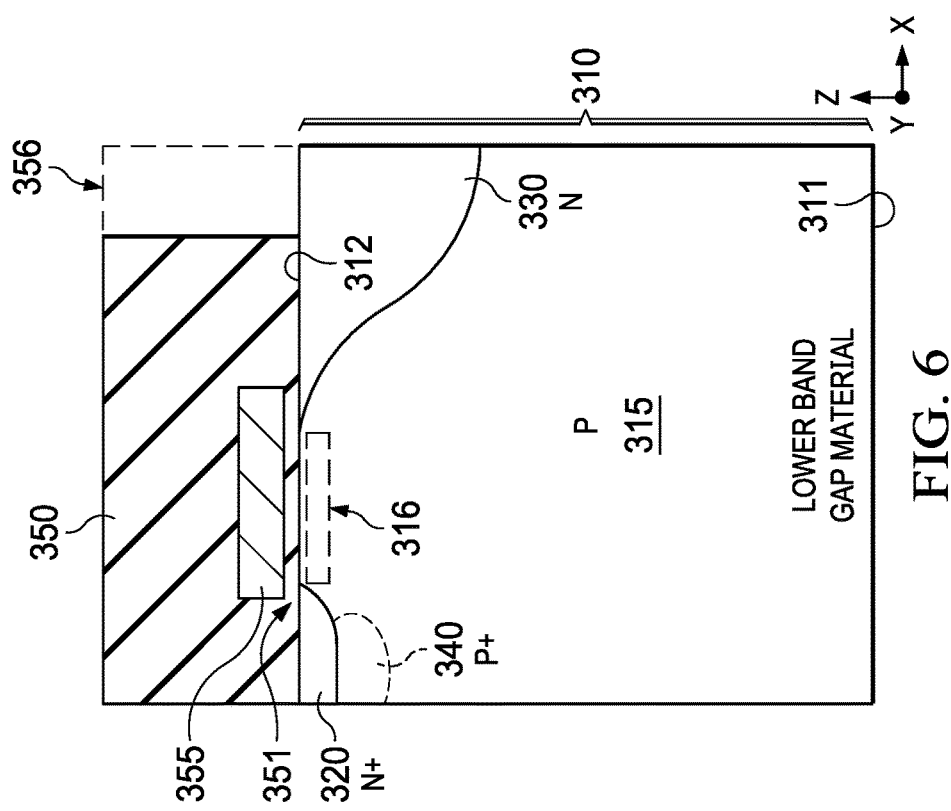

FIG. 6 illustrates a trench 356 in the dielectric layer 350; and FIG. 12 illustrates this step as forming a trench in the dielectric layer in step S804 of FIG. 12. The trench 356 may be formed by etching away a portion of the dielectric layer 350.

Figure 7:
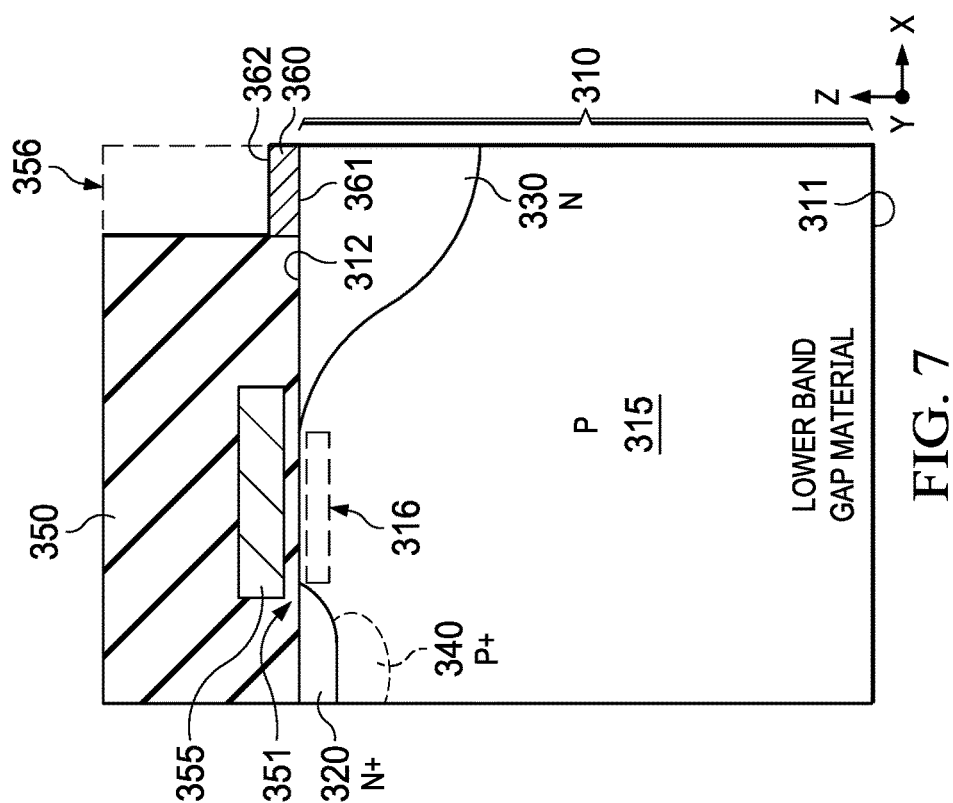

FIG. 7 illustrates a floating electrode 360 in the trench 356 and on the second surface 312 of the semiconductor layer 310; and FIG. 12 illustrates this step as forming a floating electrode in the trench and on the semiconductor layer in step S805 of FIG. 12. The floating electrode 360 may be formed by vapor deposition, such as chemical vapor deposition (CVD).

The floating electrode 360 has a first end 361 and a second end 362; and the first end 361 is coupled to and in contact with the drift region 330. A floating electrode may be used to electrically couple a first component to a second component to allow for ohmic contact to the first and second components without barrier voltage, where the first and second components include dissimilar band gap materials. Doping levels of portions of the first and second components and in contact with the floating electrode may be increased as compared to other portions of the first and second components. A material of a floating electrode may include at least one of metal or silicide. A floating electrode may be used between two components, such as two components having materials with different band-gaps or different energy band structures, for uninterrupted no barrier current flow between the two components.

Figure 8:
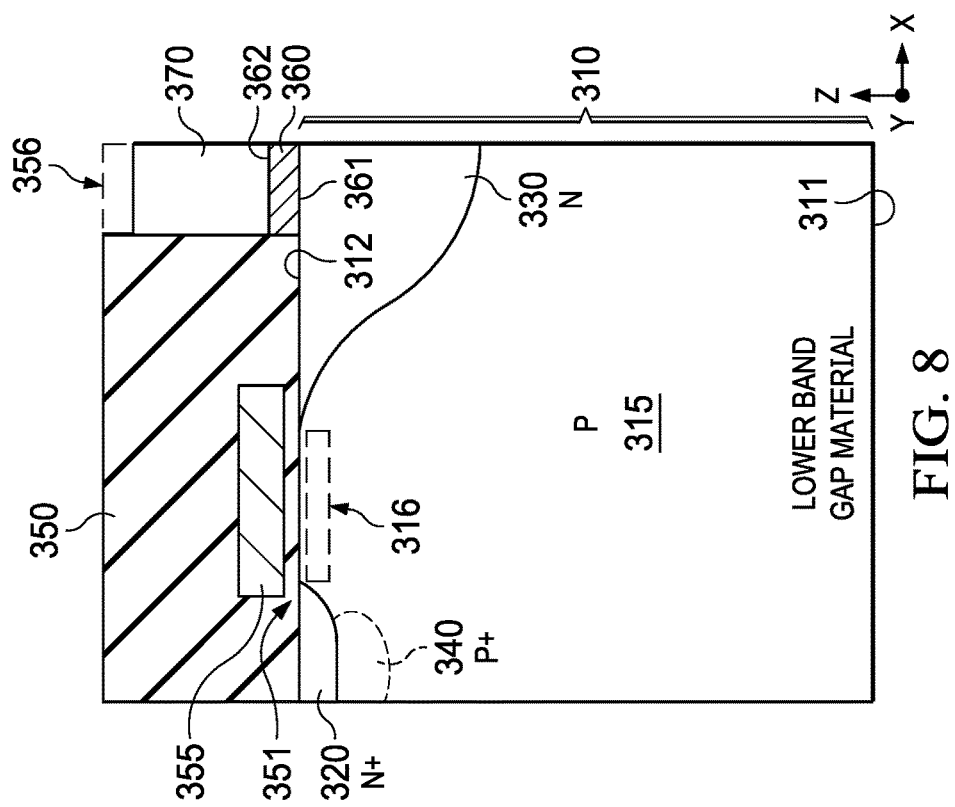

FIG. 8 illustrates a voltage support structure 370 in the trench 356 and on the floating electrode 360; and FIG. 12 illustrates this step as forming a voltage support structure on the floating electrode in step S806 of FIG. 12. The voltage support structure 370 may include a WBG semiconductor that has a larger band-gap than the semiconductor of the semiconductor layer 310. In some examples, the WBG semiconductor of the voltage support structure 370 includes silicon carbide, gallium nitride, and/or any other suitable WBG semiconductor. The voltage support structure 370 may be formed by vapor deposition, such as chemical vapor deposition (CVD), and/or ion implantation.

Figure 9:
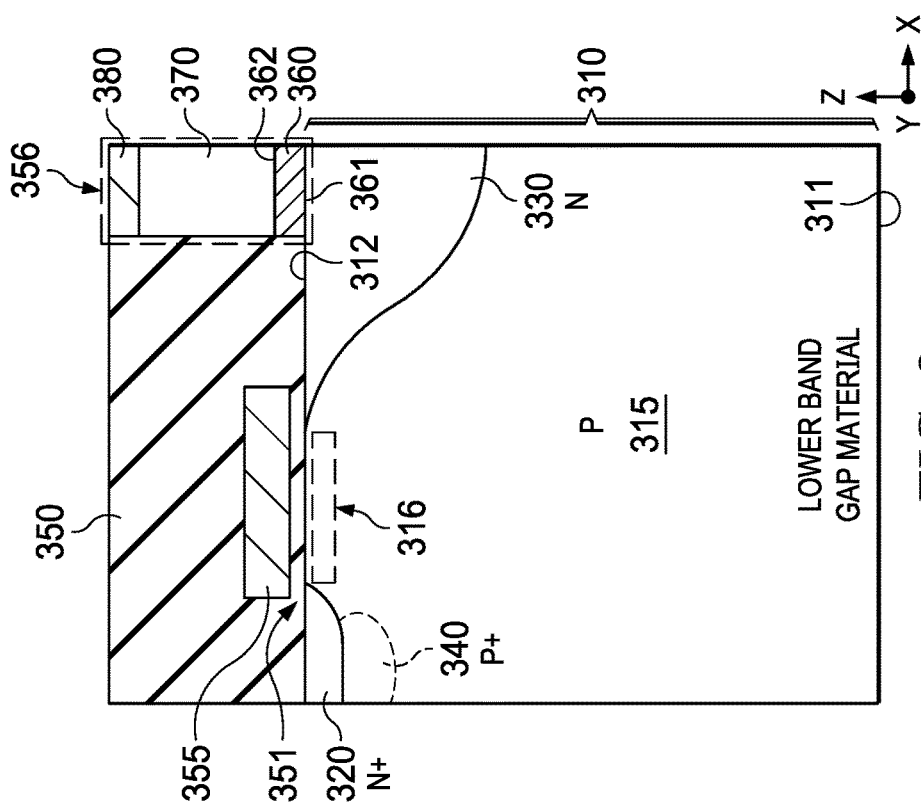

FIG. 9 illustrates a drain contact 380 in the trench 356 and on the voltage support structure 370; and FIG. 12 illustrates this step as forming a drain contact in the trench and on the voltage support structure in step S807 of FIG. 12. In some examples, the drain contact 380 includes a silicide portion in contact with the voltage support structure 370, and an aluminum portion on the silicide portion. The drain contact 380 may be formed using vapor deposition.

FIG. 10 illustrates trenches 357 in the dielectric layer 350; and FIG. 12 illustrates this step as forming trenches in the dielectric layer in step S808 of FIG. 12. The trenches 357 may be formed by etching the dielectric layer 350 with a mask.

FIG. 11 illustrates a source contact 390 and a field plate 395 in the trenches 357; and FIG. 12 illustrates this step as forming a source contact and a field plate in the trenches in step S809 of FIG. 12. The source contact and the field plate may be formed by vapor deposition. In the examples of FIG. 11, the source contact 390 is in contact with the source region 320 and the body-contact region 340. In some examples, the source contact 390 includes a silicide portion and an aluminum portion on the silicide portion; and the field plate includes a silicide portion and an aluminum portion on the silicide portion.

In the examples of FIG. 11, the field plate 395 and the source contact 390 are structurally integrated as a single piece. In other examples, the field plate and the source contact are structurally separate pieces; and the field plate is electrically coupled to the source contact or another voltage contact.

FIG. 11 illustrates an example hybrid semiconductor device 300 according to described examples. The hybrid semiconductor device 300 includes the semiconductor layer 310 that has the source region 320, the drift region 330, the body region 315 including the channel region 316, and the body-contact region 340. A material of the semiconductor layer 310 may include at least one of silicon, germanium, or gallium arsenide. The semiconductor layer 310 has the first surface 311 and the opposing second surface 312. Along an in-plane direction (X-axis), the channel region 316 of the body region 315 is between the source region 320 and the drift region 330. The hybrid semiconductor device 300 further includes the dielectric layer 350 and a gate 355 on the second surface 312 of the semiconductor layer 310. The dielectric portion 351 of the dielectric layer 350 is between the gate 355 and the second surface 312 of the semiconductor layer 310, and, accordingly, separates the gate 355 from the second surface 312 of the semiconductor layer 310. The gate 355 extends along an in-plane direction (X-axis) and is configured to turn on and turn off the channel regions 316 between the source region 320 and the drift region 330 along the in-plane direction (X-axis); and accordingly the gate 355 is a lateral gate that extends along the in-plane direction (X-axis).

The hybrid semiconductor device 300 further includes the floating electrode 360 on the drift region 330, the voltage support structure 370 on the floating electrode 360, the drain contact 380 on the voltage support structure 370, the source contact 390, and the field plate 395 that is an implementation of a field-control element, such as the field-control element 160 in FIG. 1. The voltage support structure 370 includes a first region 371 that is in ohmic contact with the second end 362 of the floating electrode 360, and a second region 372 that is in ohmic contact with the drain contact 380. In the examples of FIG. 11, the body region 315 is electrically coupled to the source contact 390 via the body-contact region 340, and extends from the regions of or near the source contact 390 towards the drain contact 380, e.g., along approximately the in-plane direction (X-axis); and the body region 315 serves as an implementation of a field-control element, such as the field-control element 160 in FIG. 1.

In the examples of FIG. 11, the floating electrode 360 has a first end 361 and a second end 362; and the first end 361 is on and in ohmic contact with the drift region 330; and the voltage support structure 370 is on the floating electrode 360 and is in ohmic contact with the second end 362 of the floating electrode 360. The drain contact 380 is on the voltage support structure 370. By arranging the voltage support structure 370 and the floating electrode 360 on the drift region 330 of the semiconductor layer 310 along an out-of-plane direction (Z axis), e.g., vertical direction, the device size along the in-plane direction (e.g. along X axis) may be reduced. The source contact 390 is in ohmic contact with the source region 320 and the body-contact region 340; and the field plate 395 extends from the source contact 390 towards the drain contact 380 and the voltage support structure 370.

The voltage support structure 370 may include a WBG semiconductor that has a larger band-gap than the semiconductor of the semiconductor layer 310. In some examples, the WBG semiconductor of voltage support structure 370 includes silicon carbide, gallium nitride, and/or any other suitable WBG semiconductor. In some examples, the WBG semiconductor of the voltage support structure 370 includes nano-materials having a WBG, such as silicon-carbide nano-tube materials or any other suitable WBG nano-materials.

In the examples of FIG. 11, The hybrid semiconductor device 300 includes a switch element 319; and the switch element 319 includes the source region 320, the drift region 330, the body region 315 or a portion of the body region 315 that includes the channel region 316, a body-contact region 340, the gate 355, and the dielectric portion 351 of the dielectric layer 350. The hybrid semiconductor device 300 further includes the source contact 390, the floating electrode 360, the voltage-support structure 370, the drain contact 380, and field control elements including the field plate 395 and the body region 315 extending from the regions of or near the source contact 390 towards the drain contact 380, e.g., along approximately the in-plane direction (X-axis). The voltage-support structure 370 is on the switch element 319 and extends, e.g., vertically, in a direction orthogonal to a surface of the switch element 319 (e.g., the second surface 312 of the semiconductor layer 310).

In some examples, the first end 361 of the floating electrode 360 is in ohmic contact with the drift region 330 of the switch element 319; the second end 362 of the floating electrode 360 is in ohmic contact with voltage-support structure 370; and the body-contact region 340 of the switch element 319 is in ohmic contact with the source contact 390. In some examples, regions (e.g., 371, 372) of the voltage-support structure 370 in contact with the floating electrode 360 and the drain contact 380 are doped with an increased doping level as compared to other regions of the voltage-support structure 370, and form ohmic contacts with the floating electrode 360 and the drain contact 380; region 331 of the drift region 330 that is in contact with the floating electrode 360 is doped with an increased doping level as compared to other regions of the drift region 330, and forms ohmic contact with the floating electrode 360.

Figure 13:
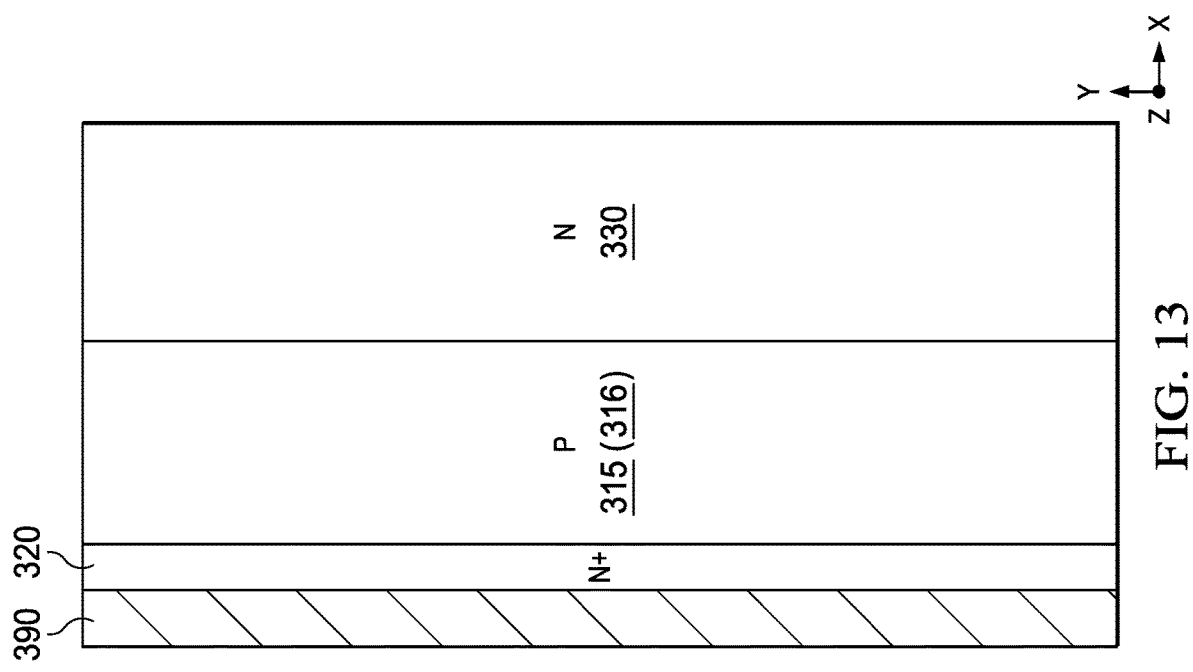
FIG. 13 illustrates another example cross-sectional view of the hybrid semiconductor device of FIG. 11.
Figure 14:
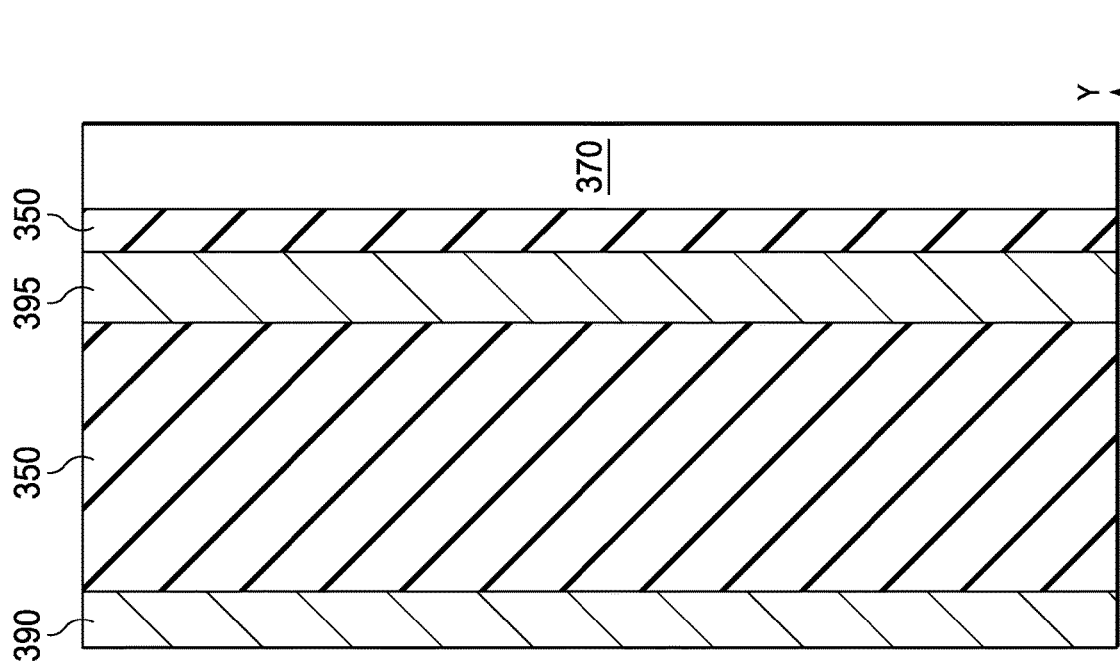
FIG. 14 illustrates another example cross-sectional view of the hybrid semiconductor device of FIG. 11.

FIG. 13 illustrates an example cross-sectional view of the hybrid semiconductor device 300 of FIG. 11 across A1-A2 according to described examples. In the examples of FIG. 13, the source contact 390, the source region 320, the body region 315 that includes channel region 316, and the drift region 330 extends along the in-plane direction (Y-axis) in a stripe configuration. FIG. 14 illustrates another example cross-sectional view of the hybrid semiconductor device 300 of FIG. 11 across B1-B2 according to described examples. In the examples of FIG. 14, the source contact 390, the dielectric layer 350, the field plate 395, and the voltage support structure 370 extends along the in-plane direction (Y-axis) in a stripe configuration.

In the examples of FIGS. 13 and 14, certain components (such as 390, 320, 315, 316, 330, 350, 395) of the hybrid semiconductor device 300 extend along an in-plane direction (Y-axis) in a stripe configuration. In other examples, certain components (such as 390, 320, 316, 315, 330, 350, 395, 370) of the hybrid semiconductor device 300 extend in-plane (e.g., parallel to X-Y plane) in a circular or annular shape. For example, certain components (such as 390, 320, 316, 315, 330, 350, 395, 370) of the hybrid semiconductor device 300 extend around axis O1-O2 in FIG. 11 in, e.g., a circular or annular configuration.

Figure 15:
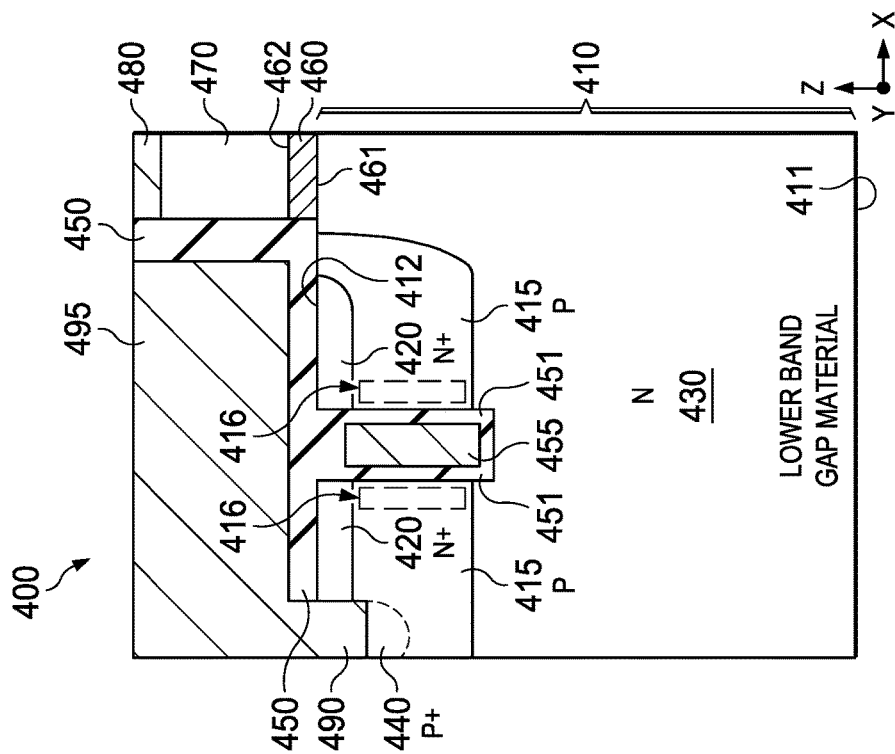
FIG. 15 illustrates a cross-sectional view of another example hybrid semiconductor device according to described examples.

FIG. 15 illustrates a cross-sectional view of another example hybrid semiconductor device 400 according to described examples. The hybrid semiconductor device 400 includes a semiconductor layer 410 that has a source region 420, a drift region 430, a body region 415 including one or more channel region 416, and a body-contact region 440. The semiconductor layer 410 has the first surface 411 and the opposing second surface 412. Along an out-of-plane direction (Z-axis), the channel regions 416 of the body region 415 extend between the source region 420 and the drift region 430. The hybrid semiconductor device 400 further includes a gate 455 and dielectric layers 451 that separate the gate 455 from the body region 415 of the semiconductor layer 410. The gate 455 extends along the out-of-plane direction (Z-axis) and is configured to turn on and turn off the channel regions 416 between the source region 420 and the drift region 430 along the out-of-plane direction (Z-axis); and accordingly the gate 455 is a vertical gate that extends along the out-of-plane direction.

The hybrid semiconductor device 400 further includes a dielectric layer 450 on the second surface 412 of the semiconductor layer 410, a floating electrode 460 on the drift region 430, a voltage support structure 470 on the floating electrode 460, a drain contact 480 on the voltage support structure 470, a source contact 490, and a field plate 495.

In the examples of FIG. 15, the floating electrode 460 has a first end 461 and a second end 462; and the first end 461 is on and in ohmic contact with the drift region 430; and the voltage support structure 470 is on the floating electrode 460 and is in ohmic contact with the second end 462 of the floating electrode 460. The drain contact 480 is on the voltage support structure 470. The source contact 490 is in ohmic contact with the source region 420 and the body-contact region 440; and the field plate 495 extends from the source contact 490 towards the drain contact 480 and the voltage support structure 470.

The voltage support structure 470 includes a WBG semiconductor that has a larger band-gap than the semiconductor of the semiconductor layer 410. In some examples, the WBG semiconductor of voltage support structure 470 includes silicon carbide, gallium nitride, and/or any other suitable WBG semiconductor. In some examples, the WBG semiconductor of voltage support structure 470 includes nano-materials having a WBG, such as SiC nano-tube materials, or any other suitable nano-materials.

Figure 21:
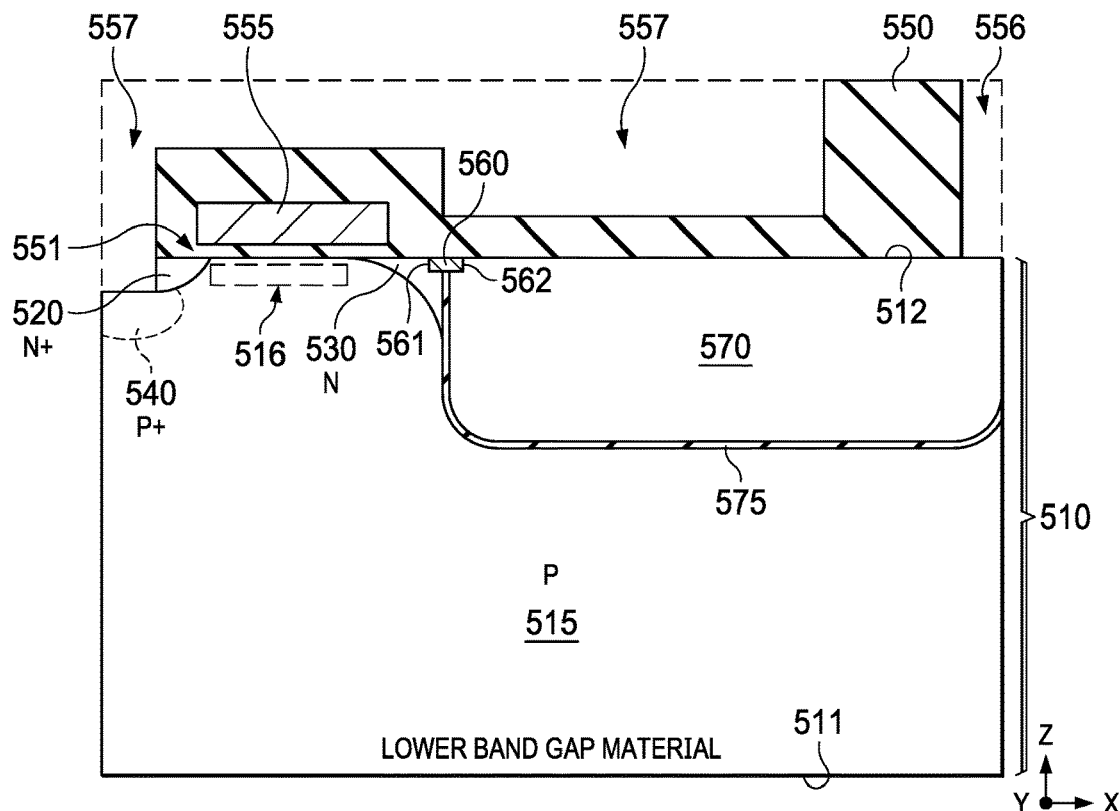
Figure 22:
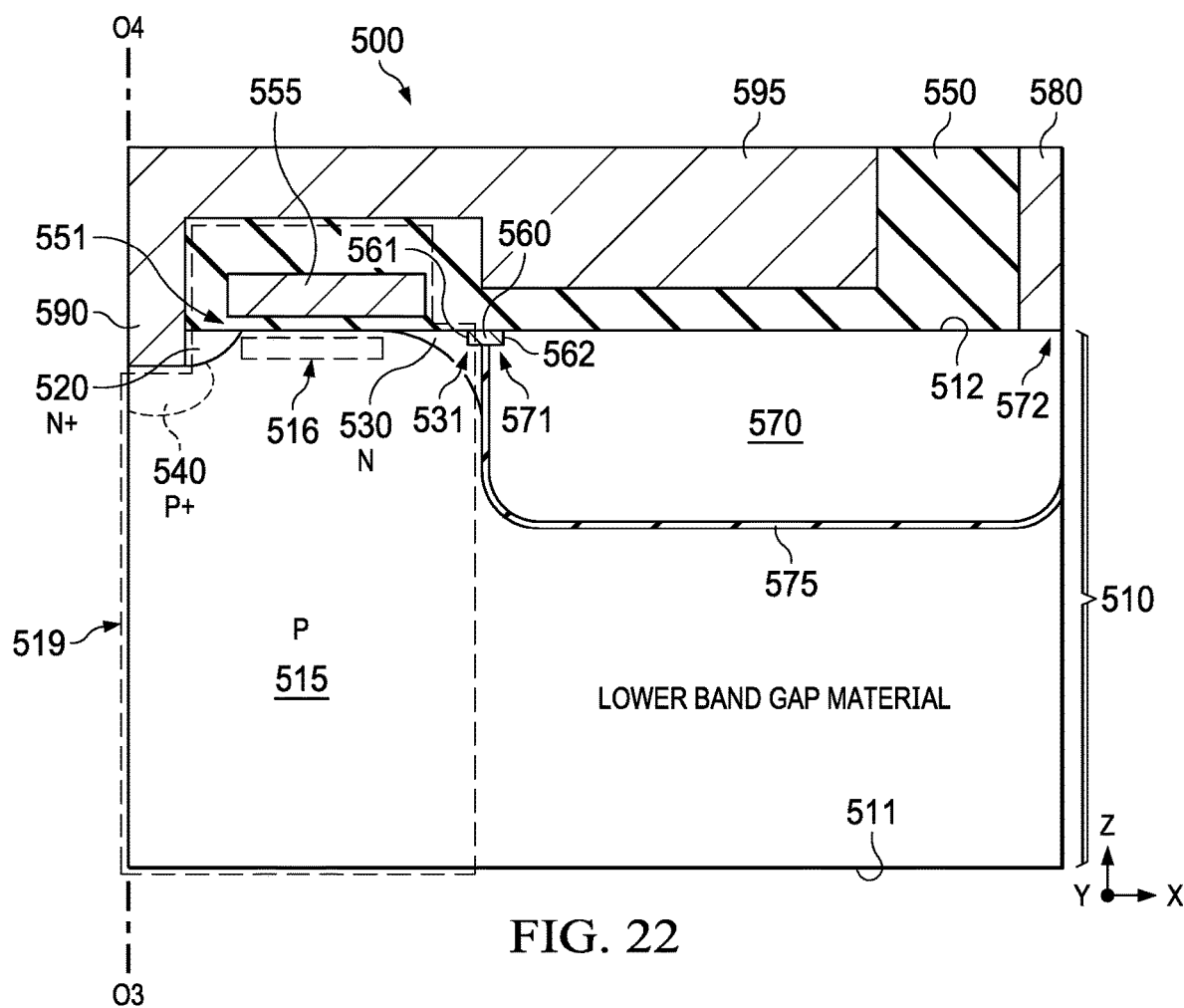
Figure 23:
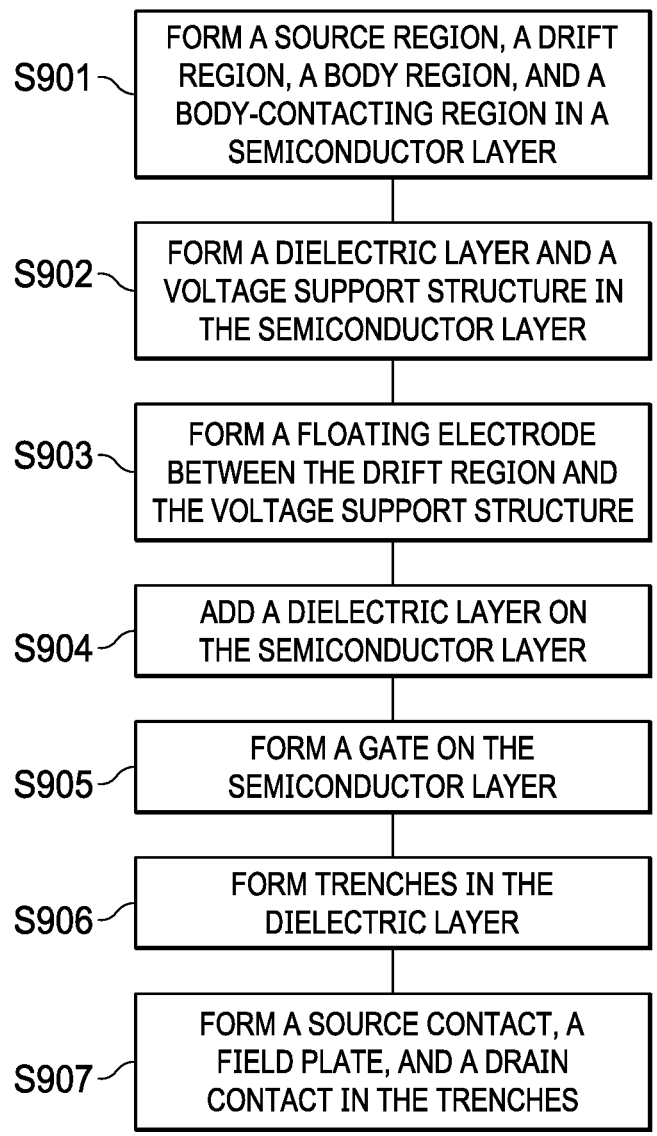
FIG. 23 illustrates a flow chart of an example method for forming the hybrid semiconductor device of FIG. 22.

FIGS. 16 to 22 illustrate cross-sectional views of structures of various stages of the formation of another example hybrid semiconductor device 500, and FIG. 23 illustrates a corresponding flow chart of an example method for forming the hybrid semiconductor device 500. FIGS. 16 to 22 will now be described along with references to the flow chart of FIG. 23.

Figure 16:
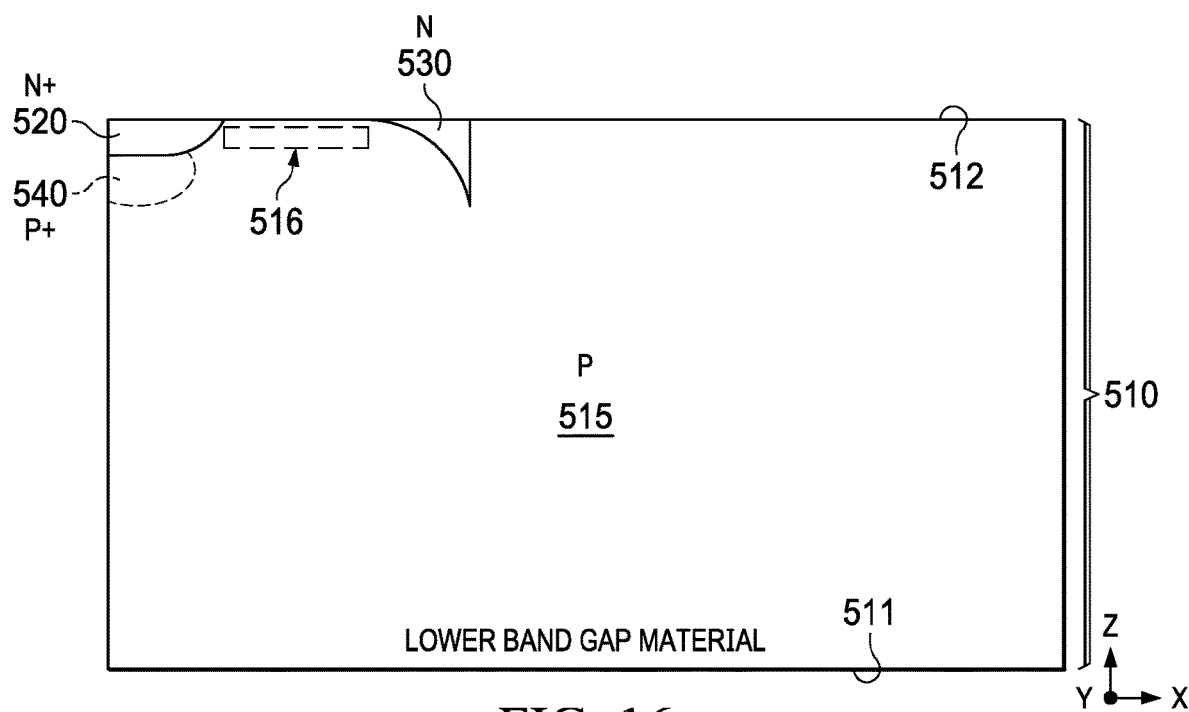
FIGS. 16 to 22 illustrate cross-sectional views of structures of various stages of the formation of another example hybrid semiconductor device.

FIG. 16 illustrates a semiconductor layer 510 including a source region 520, a drift region 530, a body region 515 including a channel region 516, and a body-contact region 540; and FIG. 23 illustrates this step as forming a source region, a drift region, a body region, and a body-contact region in a semiconductor layer in step S901 of FIG. 12.

The semiconductor layer 510 has a first surface 511 and an opposing second surface 512. A material of the semiconductor layer 510 may include at least one of silicon, germanium, or gallium arsenide. FIG. 16 also illustrates a coordinate system having X, Y, and Z axes. The X-axis and the Y-axis are orthogonal to each other and are parallel to a plane of the semiconductor layer 510, e.g., the first surface 511, or the second surface 512. The X and Y-axes are thus referred to as "in-plane direction." The Z-axis is perpendicular to the X and Y-axes and thus perpendicular to the plane of semiconductor layer 510. As such, the Z-axis is referred to as an "out-of-plane direction." Along the in-plane direction (X-axis), the channel region 516 of the body region 515 is between the source region 520 and the drift region 530.

In some examples, the semiconductor layer 510 is formed by epitaxial growth and/or ion implantation to form, e.g., a p-type layer at a P doping level; and the semiconductor layer 510 includes the body region 515. The source region 520, the drift region 530, and the body-contact region 540 may be formed by ion implantation of dopants into the semiconductor layer 510. In the examples of FIG. 16, the source region 520 is an n-type semiconductor region with an N+ doping level; the drift region 530 is an n-type semiconductor region with an N doping level; the body region 515 is a p-type semiconductor region with a P doping level; and the body-contact region 540 is a p-type semiconductor region with a P+ doping level. Other suitable doping-polarities and doping level may be chosen for the structures (e.g., 515, 520, 530, 540) of hybrid semiconductor device 500 according to various application scenarios. In the examples of FIG. 16, the body-contact region 540 is a recessed body-contact region. In other examples, the body-contact region is a planar body-contact region.

Figure 17:
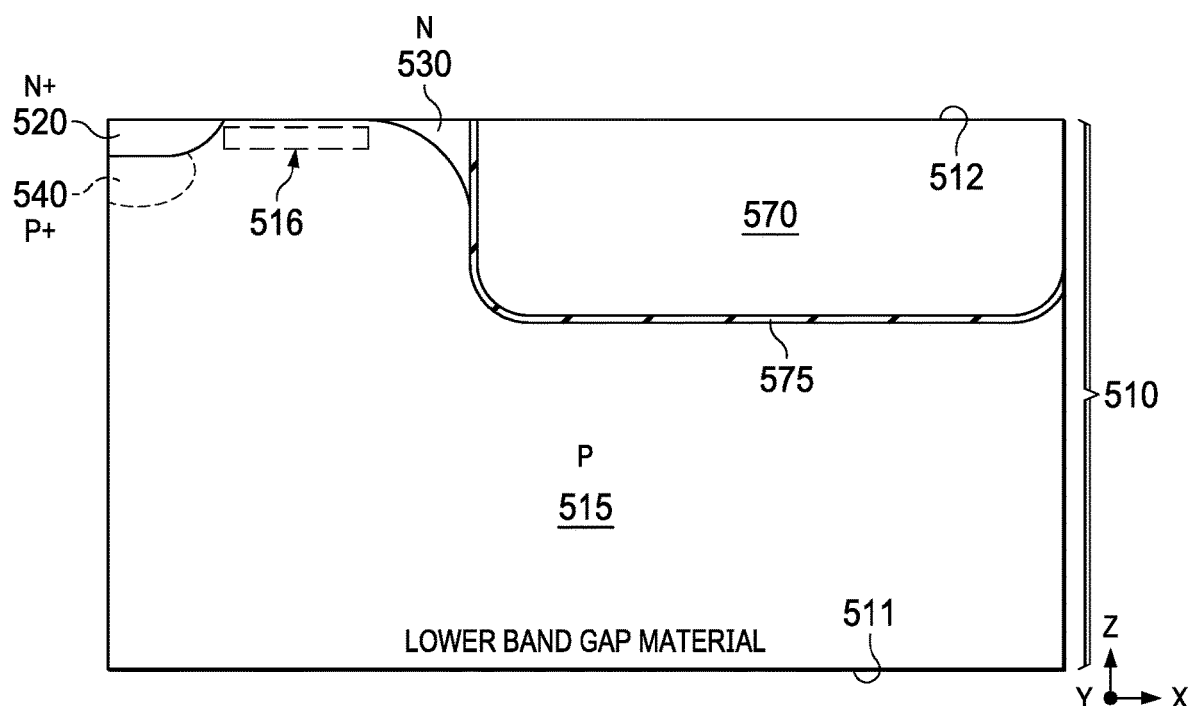

FIG. 17 illustrates a voltage support structure 570 and a dielectric layer 575 in the semiconductor layer 510; and FIG. 23 illustrates this step as forming a dielectric layer and a voltage support structure in the semiconductor layer in step S902 of FIG. 12. The dielectric layer 575 and the voltage support structure 570 may be formed by etching away a portion of the semiconductor layer 510 to form a trench, forming the dielectric layer 575 by vapor deposition or oxidation at inner walls of the trench, and depositing materials of the voltage support structure 570 into the trench and on the dielectric layer 575. In the examples of FIG. 8, the voltage support structure 570 is adjacent to the drift region 530 along the in-plane direction (X axis), e.g., laterally. The dielectric layer 575 is between the voltage support structure 570 and the body region 515, and separates the voltage support structure 570 from the body region 515.

The voltage support structure 570 may include a WBG semiconductor that has a larger band-gap than the semiconductor of the body region 515 of the semiconductor layer 510. In some examples, the WBG semiconductor of voltage support structure 570 includes silicon carbide, gallium nitride, and/or any other suitable WBG semiconductor.

Figure 18:
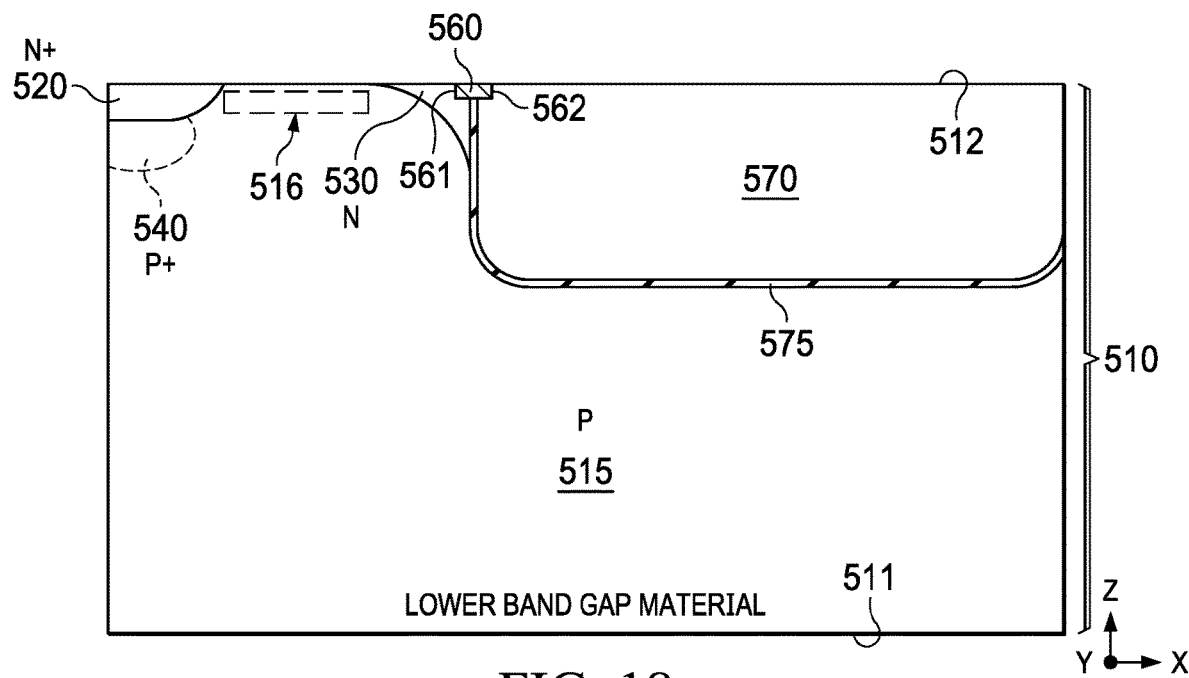

FIG. 18 illustrates a floating electrode 560 between the drift region 530 and the voltage support structure 570; and FIG. 12 illustrates this step as forming a floating electrode between the drift region and the voltage support structure in step S903 of FIG. 23. The floating electrode 560 may be formed by etching away portions of the drift region 530, the dielectric layer 575, and the voltage support structure 570 to form a trench, and depositing materials of the floating electrode 560 in the trench via vapor deposition, such as chemical vapor deposition (CVD). A material of a floating electrode may include at least one of metal or silicide.

The floating electrode 560 has a first end 561 and a second end 562; the first end 561 is coupled to and in ohmic contact with the drift region 530; and the second end 562 is coupled to and in ohmic contact with the voltage support structure 570. In the examples of FIG. 18, the voltage support structure 570, the drift region 530, and the floating electrode 560 are arranged with respect to one another along the in-plane direction (X axis), e.g., laterally.

Figure 19:
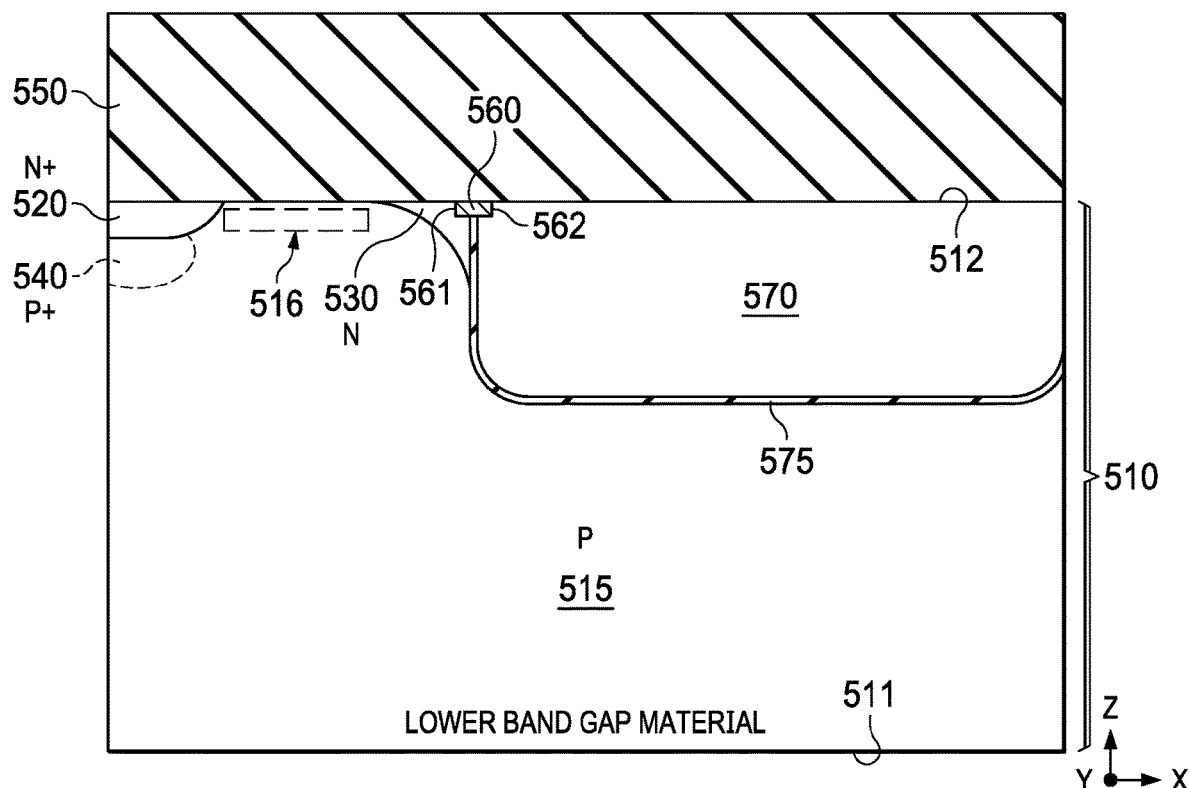

FIG. 19 illustrates a dielectric layer 550 on the second surface 512 of the semiconductor layer 510; and FIG. 23 illustrates this step as adding a dielectric layer on the semiconductor layer in step S904 of FIG. 23. A material of the dielectric layer 550 may include nitride material such as silicon nitride, aluminum nitride, and/or oxide materials such as silicon oxide, aluminum oxide. The dielectric layer 550 may be added on the semiconductor layer 510 by vapor deposition or bonding.

Figure 20:
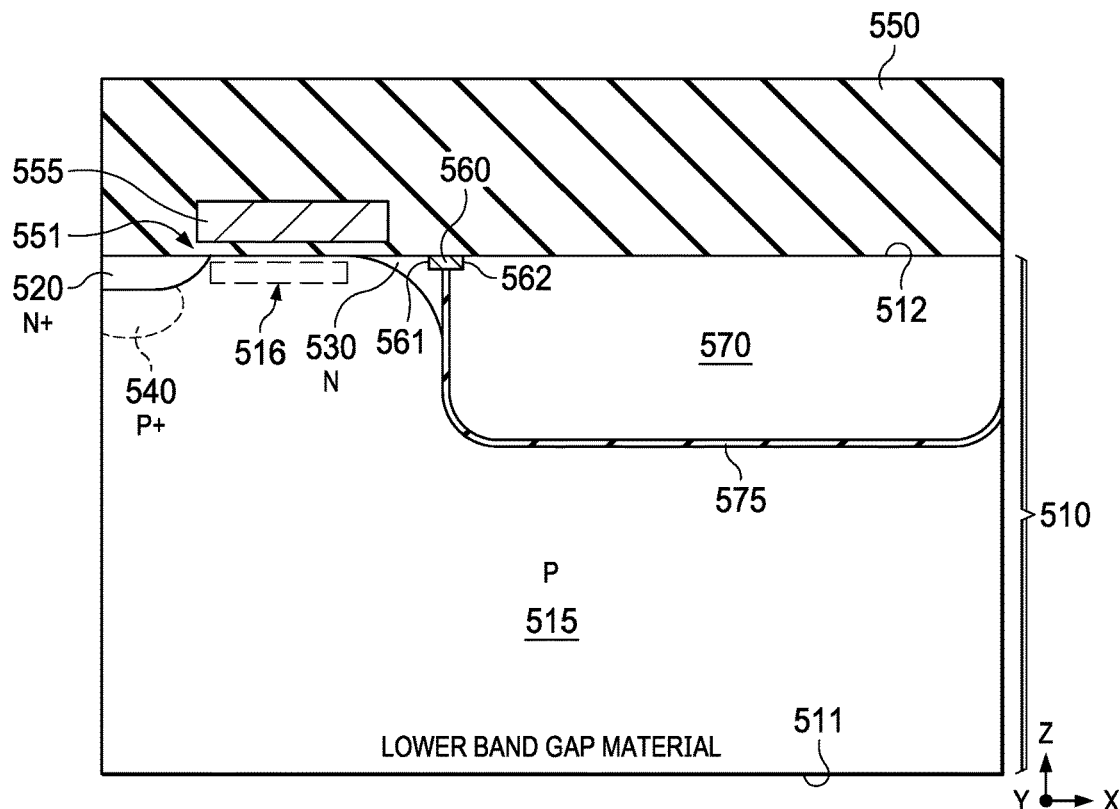

FIG. 20 illustrates a gate (e.g., a gate terminal) 555 on the second surface 512 of the semiconductor layer 510; and FIG. 23 illustrates this step as forming a gate on the semiconductor layer 510 in step S905 of FIG. 23. In the examples of FIG. 20, the gate 555 corresponds to the channel region 516 of the body region 515; and a dielectric portion 551 of the dielectric layer 550 is between the gate 555 and the second surface 512 of the semiconductor layer 510, and, accordingly, separates the gate 555 from the second surface 512 of the semiconductor layer 510.

The gate 555 may be formed by etching a trench in the dielectric layer 550 and depositing gate materials in the trench. In one example, a material of the gate 555 may include polysilicon and/or metal. In some examples, a dielectric material such as nitride or oxide is further deposited in the trench and on the gate 555.

FIG. 21 illustrates trenches 556 and 557 in the dielectric layer 550; and FIG. 23 illustrates this step as forming trenches in the dielectric layer in step S906 of FIG. 23. The trenches 556 and 557 may be formed by etching the dielectric layer 550 with a mask.

FIG. 22 illustrates a source contact 590, a field plate 595, and a drain contact 580; and FIG. 23 illustrates this step as forming a source contact, a field plate, and a drain contact in the trenches in step S907 of FIG. 23. In the examples of FIG. 22, the source contact 590 is in ohmic contact with the source region 520 and the body-contact region 540. In some examples, the source contact 590 includes a silicide portion and an aluminum portion on the silicide portion; and the field plate 595 includes a silicide portion and an aluminum portion on the silicide portion. The drain contact 580 is on the voltage support structure 570. In some examples, the drain contact 580 includes a silicide portion in contact with the voltage support structure 570, and an aluminum portion on the silicide portion. The source contact 590, the field plate 595, and the drain contact 580 may be formed using vapor deposition.

FIG. 22 illustrates an example hybrid semiconductor device 500 according to described examples. The hybrid semiconductor device 500 includes the semiconductor layer 510. The semiconductor layer 510 includes the source region 520, the drift region 530, the body region 515 including the channel region 516, and the body-contact region 540. The semiconductor layer 510 has the first surface 511 and the opposing second surface 512.

The hybrid semiconductor device 500 further includes the voltage support structure 570 and the dielectric layer 575, the floating electrode 560 between the drift region 530 and the voltage support structure 570, the dielectric layer 550 and the gate 555 on second surface 512 of the semiconductor layer 510, the source contact 590, the field plate 595, and the drain contact 580 in trenches formed in the dielectric layer 550.

The voltage support structure 570 is adjacent to the drift region 530 along the in-plane direction (X axis), e.g., laterally. The dielectric layer 575 is between the voltage support structure 570 and the body region 515, and separates the voltage support structure 570 from the body region 515. The voltage support structure 570 may include a WBG semiconductor that has a larger band-gap than the semiconductor of the source region 520, the drift region 530, the body region 515 including the channel region 516, and the body-contact region 540. In some examples, the WBG semiconductor of voltage support structure 570 includes silicon carbide, gallium nitride, and/or any other suitable WBG semiconductor.

The floating electrode 560 has a first end 561 and a second end 562; the first end 561 is coupled to and in ohmic contact with the drift region 530; and the second end 562 is coupled to and in ohmic contact with the voltage support structure 570. The voltage support structure 570, the drift region 530, and the floating electrode 560 are arranged with respect to one another along the in-plane direction (X axis), e.g., laterally.

The gate 555 corresponds to the channel region 516 of the body region 515; and the dielectric portion 551 of the dielectric layer 550 is between the gate 555 and the second surface 512 of the semiconductor layer 510, and, accordingly, separates the gate 555 from the second surface 512 of the semiconductor layer 510.

The source contact 590 is in ohmic contact with the source region 520 and the body-contact region 540. In some examples, the source contact 590 includes a silicide portion and an aluminum portion on the silicide portion; and the field plate 595 includes a silicide portion and an aluminum portion on the silicide portion. The field plate 595 extends from the source contact 590 towards the drain contact 580. The drain contact 580 is on the voltage support structure 570. In some examples, the drain contact 580 includes a silicide portion in contact with the voltage support structure 570, and an aluminum portion on the silicide portion.

In the examples of FIG. 22, the field plate 595 and the source contact 590 are structurally integrated as a single piece. In other examples, the field plate and the source contact are structurally separate pieces; and the field plate is electrically coupled to the source contact or another voltage contact.

In some examples, certain components (such as 590, 520, 516, 515, 530, 550, 595, 570) of the hybrid semiconductor device 500 extend along the in-plane direction (Y-axis) in a stripe configuration. In other examples, certain components (such as 590, 520, 516, 515, 530, 550, 595, 570) of the hybrid semiconductor device 500 extend in-plane (e.g., parallel to X-Y plane) in a circular or annular shape. For example, certain components (such as 590, 520, 516, 515, 530, 550, 595, 570) of the hybrid semiconductor device 500 extend around axis O3-O4 in FIG. 22 in, e.g., a circular or annular configuration.

In the examples of FIG. 22, the hybrid semiconductor device 500 includes a switch element 519; and the switch element 519 includes the source region 520, the drift region 530, the body region 515 or a portion of the body region 515 that includes the channel region 516, a body-contact region 540, the gate 555, and the dielectric portion 551 of the dielectric layer 550. The hybrid semiconductor device 500 further includes the floating electrode 560, the voltage-support structure 570, the drain contact 580, the source contact 590, and field control elements including the field plate 595 and the body region 515 extending from the regions of or near the source contact 590 towards the drain contact 580, e.g., along approximately the in-plane direction (X-axis). The voltage-support structure 570 is adjacent to the switch element 519 along the in-plane direction (X-axis), and extends, e.g., laterally, in a direction parallel to a surface of the switch element 519 (e.g., a portion of the second surface 512 of the semiconductor layer 510). In some examples the voltage-support structure 570 is at least partially surrounded by the switch element 519.

In some examples, the first end 561 of the floating electrode 560 is in ohmic contact with the drift region 530 of the switch element 519; the second end 562 of the floating electrode 560 is in ohmic contact with the voltage-support structure 570; and the body-contact region 540 of the switch element 519 is in ohmic contact with the source contact 590. In some examples, regions (e.g., 571, 572) of the voltage-support structure 570 that are in contact with the floating electrode 560 and the drain contact 580 are doped with an increased doping level as compared to other regions of the voltage-support structure 570, and form ohmic contacts with the floating electrode 560 and the drain contact 580; and region 531 of the drift region 530 that is in contact with the floating electrode 560 is doped with an increased doping level as compared to other regions of the drift region 530, and forms ohmic contact with the floating electrode 560.

Figure 24:
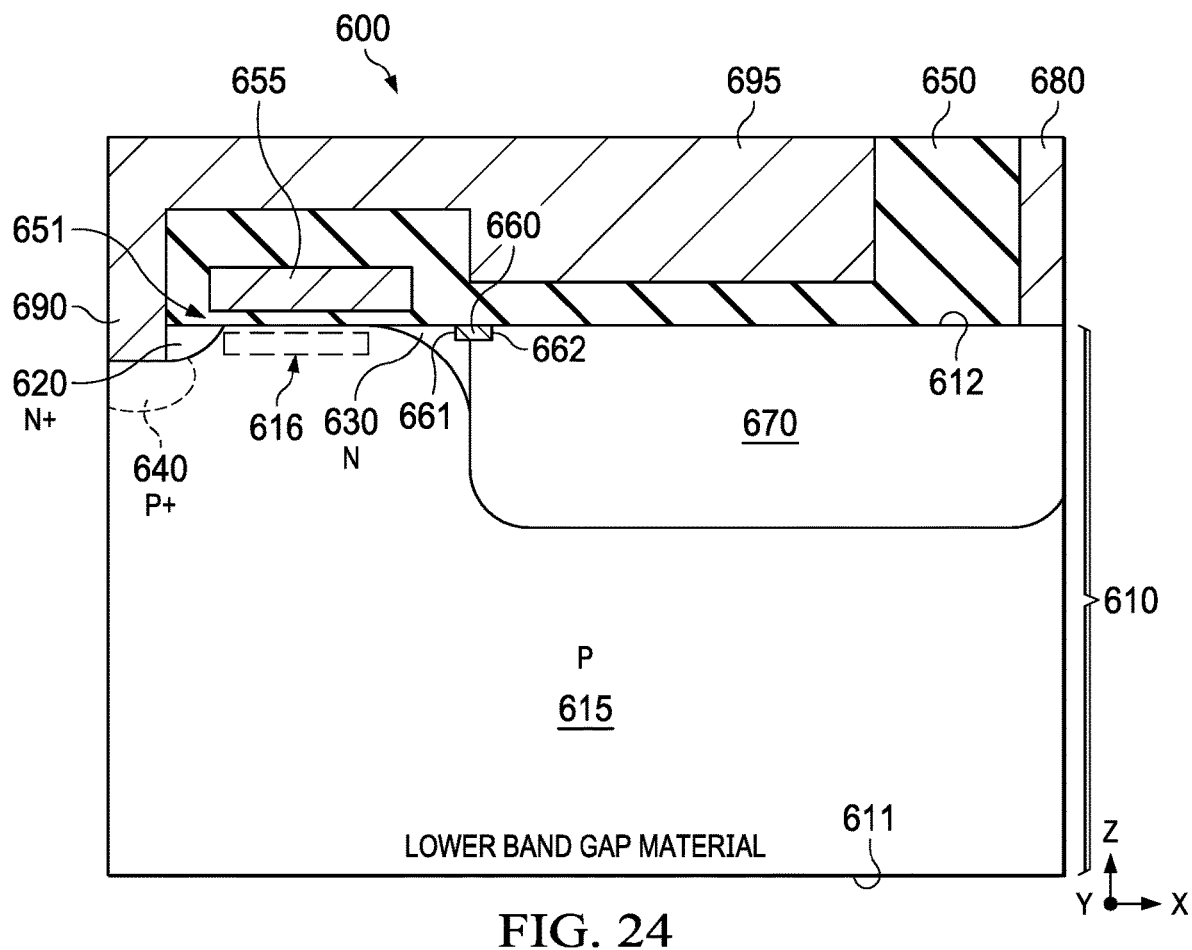
FIG. 24 illustrates another example hybrid semiconductor device according to described examples.

FIG. 24 illustrates another example hybrid semiconductor device 600 according to described examples. The hybrid semiconductor device 600 includes a semiconductor layer 610. The semiconductor layer 610 includes a source region 620, a drift region 630, a body region 615 including a channel region 616, and a body-contact region 640. The semiconductor layer 610 has a first surface 611 and an opposing second surface 612.

The hybrid semiconductor device 600 further includes a voltage support structure 670, a floating electrode 660 between the drift region 630 and the voltage support structure 670, a dielectric layer 650 and a gate 655 on the second surface 612 of the semiconductor layer 610, a source contact 690, a field plate 695, and a drain contact 680.

The voltage support structure 670 is adjacent to the drift region 630 along the in-plane direction (X axis), e.g., laterally. The voltage support structure 670 is in contact with the body region 615. The voltage support structure 670 may be formed by ion implanting dopants into the semiconductor layer 610 or by etching away a portion of the semiconductor layer 610 to form a trench and depositing materials of the voltage support structure 670 into the trench. In some examples, the semiconductor layer 610 is a silicon layer, the voltage support structure 670 is formed by ion implanting carbon into the semiconductor layer 610 and activating the implanted region to form silicon carbide as the voltage support structure 670. The voltage support structure 670 may include a WBG semiconductor that has a larger band-gap than the semiconductor of the semiconductor layer 610. In some examples, the WBG semiconductor of the voltage support structure 670 includes silicon carbide, gallium nitride, and/or any other suitable WBG semiconductor.

Certain components of the hybrid semiconductor device 600 are the same as or similar to above-described components of hybrid semiconductor devices, and references can be made to above descriptions of components of the hybrid semiconductor devices, such as components of the hybrid semiconductor device 500.

Modifications, additions, or omissions may be made to the devices, systems, apparatuses, and methods described herein without departing from the scope of the disclosure. Moreover, the operations of the devices, systems, and apparatuses disclosed herein may be performed by including more, fewer, or other components; and the methods described may include more, fewer, or other steps. Additionally, steps may be performed in any suitable order.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A semiconductor device, comprising:
 a switch element having a surface and first and second regions and including a first semiconductor material having a band-gap, the first region of the switch element being coupled to a source contact;
 a floating electrode having first and second ends, the first end of the floating electrode being coupled to the second region of the switch element;
 a voltage-support structure including a second semiconductor material having a band-gap that is larger than the band-gap of the first semiconductor material, the voltage-support structure being in contact with the second end of the floating electrode; and
 a drain contact coupled to the voltage-support structure.

2. The semiconductor device of claim 1, wherein the floating electrode includes at least one of metal or silicide.

3. The semiconductor device of claim 1, wherein:
 the first end of the floating electrode is in ohmic contact with the second region of the switch element; and
 the second end of the floating electrode is in ohmic contact with voltage-support structure.

4. The device of claim 1, wherein the switch element is at least one of a diode, a bipolar transistor, a field-effect transistor, or an insulated-gate bipolar transistor.

5. The device of claim 4, wherein:
 the switch element includes a field-effect transistor; and
 the field-effect transistor is a p-type field-effect transistor or an n-type field-effect transistor.

6. The device of claim 5, wherein the switch element is a laterally-diffused metal oxide semiconductor field-effect transistor.

7. The device of claim 5, wherein the switch element includes a gate.

8. The device of claim 7, wherein the gate of the switch extends in a direction orthogonal to the surface of the switch element or extends in a direction parallel to the surface of the switch element.

9. The device of claim 1, wherein the second semiconductor material includes at least one of silicon carbide or gallium nitride.

10. The device of claim 1, wherein the second semiconductor material includes a nano-tube material.

11. The device of claim 1, wherein the first semiconductor material includes at least one of silicon, germanium, or gallium arsenide.

12. The device of claim 1, further comprising:
 a field-control element extending towards the drain contact.

13. The device of claim 12, wherein the field-control element is a field plate electrically coupled to the source contact or another voltage contact.

14. The device of claim 12, wherein:
 the field-control element is a third region of the switch element; and
 the third region of the switch element is coupled to the source contact and extends towards the drain contact.

15. The device of claim 1, wherein the voltage-support structure is on the switch element and extends in a direction orthogonal to the surface of the switch element.

16. The device of claim 1, wherein:
 the voltage-support structure extends in a direction parallel to the surface of the switch element; and
 the voltage-support structure is at least partially surrounded by the switch element.

17. A semiconductor device, comprising:
 a source contact;
 a switch element having:
  a surface,
  a first semiconductor region being of a first doping-polarity and including a channel region,
  a source region being of a second doping-polarity and in contact with the source contact and the first semiconductor region, and
  a drain region being of the second doping-polarity and in contact with the first semiconductor region, and
  a gate corresponding to the channel region of the first semiconductor region, wherein the first semiconductor region, the source region, and the drain region each includes a first semiconductor material having a band-gap;
 a floating electrode having first and second ends, the first end of the floating electrode being coupled to the drain region of the switch element;

a voltage-support structure including a second semiconductor material having a band-gap that is larger than the band-gap of the first semiconductor material, the voltage-support structure being in contact with the second end of the floating electrode; and a drain contact coupled to the voltage-support structure.

18. The device of claim 17, wherein the voltage-support structure is on the switch element and extends in a direction orthogonal to the surface of the switch element.

19. A method for forming a semiconductor device, comprising:

forming a switch element that includes a first semiconductor material having a band-gap;

forming a floating electrode having first and second ends, the first end of the floating electrode being coupled to the switch element;

forming a voltage-support structure including a second semiconductor material having a band-gap that is larger than the band-gap of the first semiconductor material;

forming a source contact coupled to the switch element;

forming a drain contact coupled to the voltage-support structure; and forming a field control element.

20. The method of claim 19, wherein the first semiconductor material includes at least one of silicon, germanium, or gallium arsenide.

* * * * *